US008471641B2

(12) United States Patent
Quevy et al.

(10) Patent No.: US 8,471,641 B2
(45) Date of Patent: Jun. 25, 2013

(54) SWITCHABLE ELECTRODE FOR POWER HANDLING

(75) Inventors: Emmanuel P. Quevy, El Cerrito, CA (US); Manu Seth, Berkeley, CA (US); Mehrnaz Motiee, San Francisco, CA (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 13/173,815

(22) Filed: Jun. 30, 2011

(65) Prior Publication Data

US 2013/0002364 A1  Jan. 3, 2013

(51) Int. Cl.
*H03B 5/30* (2006.01)

(52) U.S. Cl.
USPC ............ 331/116 M; 331/154; 331/156

(58) Field of Classification Search
USPC ............ 331/116 M, 154, 156; 333/186, 188, 333/200
See application file for complete search history.

(56) References Cited

U.S. PATENT DOCUMENTS

| | | | |
|---|---|---|---|
| 5,729,075 | A | 3/1998 | Strain |
| 6,557,419 | B1 | 5/2003 | Herb et al. |
| 6,739,190 | B2 | 5/2004 | Hsu et al. |
| 6,744,174 | B2 | 6/2004 | Paden et al. |
| 6,831,531 | B1 | 12/2004 | Giousouf et al. |
| 6,844,214 | B1 | 1/2005 | Mei et al. |
| 6,987,432 | B2 | 1/2006 | Lutz et al. |
| 6,988,789 | B2 | 1/2006 | Silverbrook |
| 7,008,812 | B1 | 3/2006 | Carley |
| 7,071,793 | B2 | 7/2006 | Lutz et al. |
| 7,079,299 | B1 | 7/2006 | Conant et al. |
| 7,202,761 | B2 | 4/2007 | Lutz et al. |
| 7,595,708 | B2 | 9/2009 | Lutz et al. |
| 7,639,104 | B1 | 12/2009 | Quevy et al. |
| 7,990,233 | B2 * | 8/2011 | Suzuki .......................... 333/186 |
| 2002/0151100 | A1 | 10/2002 | Coffa et al. |
| 2005/0250236 | A1 | 11/2005 | Takeuchi et al. |
| 2006/0017533 | A1 | 1/2006 | Jahnes et al. |
| 2006/0033594 | A1 | 2/2006 | Lutz et al. |
| 2006/0186971 | A1 | 8/2006 | Lutz et al. |
| 2007/0013268 | A1 | 1/2007 | Kubo et al. |
| 2008/0178672 | A1 * | 7/2008 | Kanai et al. ................. 73/504.12 |
| 2010/0093125 | A1 | 4/2010 | Quevy et al. |
| 2011/0084781 | A1 | 4/2011 | Quevy et al. |
| 2011/0090554 | A1 | 4/2011 | Tung |

OTHER PUBLICATIONS

Choo, H. et al., "A Simple Process to Fabricate Self-Aligned, High-Performance Torsional Microscanners; Demonstrated Use in a Two-Dimensional Scanner," 2005 IEEE/LEOS International Conference on Optical MEMS and Their Applications; Aug. 1-4, 2005, pp. 21-22.
Chiou, J.C. et al., "Out-of-Plane CMOS-MEMS Resonator with Electrostatic Driving and Piezoresistive Sensing," 2006 IEEE-NANO Sixth IEEE Conference on Nanotechnology, Jun. 17-20, 2006, vol. 2, pp. 929-932.

(Continued)

*Primary Examiner* — Ryan Johnson
(74) *Attorney, Agent, or Firm* — Abel Law Group, LLP

(57) ABSTRACT

A MEMS oscillator includes a resonator body and primary and secondary drive electrodes to electrostatically drive the resonator body. Primary and secondary sense electrodes sense motion of the resonator body. The primary and secondary drive and sense electrodes are configured to be used together during start-up of the MEMS oscillator. The secondary drive electrode and secondary sense electrode are disabled after start-up, while the primary drive and sense electrodes remain enabled to maintain oscillation.

19 Claims, 4 Drawing Sheets

OTHER PUBLICATIONS

Helmbrecht, Michael A., et al., "Performance of high-stroke, segmented MEMS deformable-mirror technology," MEMS/MOEMS Components and Their Applications III, Proc. of SPIE, vol. 6113, 61130L, (Jan. 2006), pp. 1-10.

Jianqiang, Han, et al., "Dependence of the resonance frequency of thermally excited microcantilever resonators on temperature," Elsevier, Sensors and Actuators, A 101 (Apr. 2002), pp. 37-41.

Schmidt, Martin A., et al., "Design and Calibration of a Microfabricated Floating-Element Shear-Stress Sensor," IEEE Transactions on Electron Devices, vol. 35, No. 6, (Jun. 1988), pp. 750-757.

Shen, F., et al., "Thermal Effects on Coated Resonant Microcantilevers," Elsevier, Sensors and Actuators, A 95, (Aug. 2001), pp. 17-23.

Tang, William C., et al., "Electrostatic Comb Drive Levitation and Control Method," Journal of Microelectromechanical Systems, vol. 1, No. 4 (Dec. 1992), pp. 170-178.

Tang, William C., et al., "Laterally Driven Polysilicon Resonant Microstructures," MEMS 1989, Proceedings, An Investigation of Micro Structures, Sensors, Actuators, Machines and Robots, IEEE (Feb. 1989), pp. 53-59.

Tung, Meng Fai, "An Introduction to MEMS Optical Switches," (Dec. 13, 2001), pp. 1-37.

Kaajakari, V., Doskinen, J.K., and Mattila, T., "Phase Noise in Capacitively Coupled Micromechanical Oscillators," IEEE Transactions on Ultrasonics, Ferroelectrics, and Frequency Control, vol. 52, No. 12, pp. 2322-2331, Dec. 2005.

* cited by examiner

SWITCHABLE ELECTRODE FOR POWER HANDLING

BACKGROUND

1. Field of the Invention

This invention relates to MEMS oscillators and more particularly to power handling associated therewith.

2. Description of the Related Art

Microelectromechanical Systems (MEMS) generally refers to an apparatus incorporating some mechanical structure having dimensions, less than, e.g., approximately 100 or 200 µm. MEMS devices are commonly used for such applications as oscillators in timing applications, accelerometers, and inertial sensors, and the number of applications is growing. Certain structural components of a MEMS device are typically capable of some form of mechanical motion. The MEMS device can be formed using fabrication techniques similar to techniques used in the electronics industry such as Low Pressure Chemical Vapor Deposition, (LPCVD), Plasma Enhanced CVD (PECVD), patterning using photolithography, and Reactive Ion Etching (RIE), etc.

MEMS devices used in timing applications include a resonator. The resonator may have a variety of physical shapes, e.g., beams and plates. FIG. 1 illustrates a conventional resonating MEMS device 100 that has a resonating member 101 coupled to an anchor 102, which in turn is coupled to the substrate 103. The MEMS device includes electrodes 105 and 107 forming electrostatic transducers with the resonating member. One of the electrodes functions as a drive electrode and the other, a sense electrode. The electrodes are coupled to appropriate voltage levels provided through appropriate conductive paths in the substrate and the resonating member 101 is coupled to an appropriate voltage level through the anchor 102. During operation, a drive electrode 105 electrostatically drives resonator 101, using a voltage differential that exists between the drive electrode 105 and resonator 101, so that resonator 101 dynamically deflects as illustrated by arrow 109 in a plane parallel to the substrate 103. A sense electrode 107 detects a change in capacitance as the capacitance varies between resonator 101 and sense electrode 107 due to the "in-plane" motion of resonator 101. The voltage sensed due to the change in capacitance corresponds to the resonating frequency of the beam 101. An oscillator circuit (not shown) typically uses the output from the sense electrode and maintains the MEMS device at a resonant frequency using the drive electrode. As is well known in the art, other vibration modes such as out-of-plane or torsional modes exist for MEMS devices.

As MEMS oscillators have the advantage of small form factor and low-cost production, they can be found in a variety of consumer products, including portable products using batteries to supply power. Improvement in power handling in MEMS oscillators is desirable to provide better performance.

SUMMARY

Accordingly, in one embodiment a MEMS oscillator includes a resonator body and a first set of electrodes to drive or sense motion of the resonator body. The first set of electrodes includes a primary electrode and a secondary electrode. The primary and secondary electrodes are configured to be used together at a first time during operation of the MEMS oscillator, and the secondary electrode is configured to be disabled at a second time during operation of the MEMS oscillator. The first time period is, e.g., at start-up and the second time-period is after start-up.

In another embodiment a MEMS oscillator includes a resonator body and a first set of drive electrodes, having primary and secondary electrodes, to electrostatically drive the resonator body. A second set of sense electrodes, having a primary and secondary electrode, senses motion of the resonator body. The primary and secondary electrodes of each set are configured to be used together during start-up of the MEMS oscillator, and the secondary electrode of each set is configured to be disabled after start-up while the primary electrode of each set remains enabled.

A method of operating a MEMS oscillator includes, during a first time period, using a first set of electrodes, including a primary and secondary electrode, together to drive movement of a resonator body. During a second time period, during oscillation of the MEMS oscillator, the secondary electrode is disabled and the primary electrode is used to sustain oscillation of the resonator body. The method may further include using a second set of electrodes having a primary and secondary electrode together to sense movement of the resonator body during the first time period. During the second time period the secondary electrode of the second set is disabled and using the primary electrode is used to sense movement of the resonator body during the second time period.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
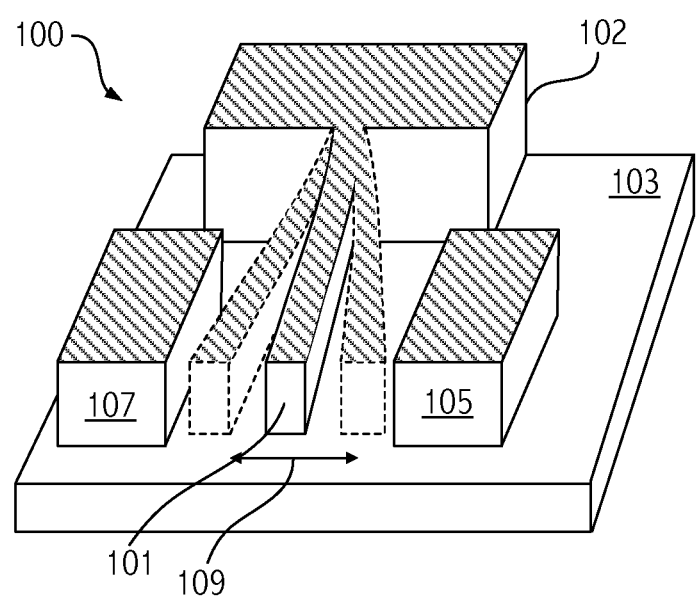
FIG. 1 illustrates a conventional MEMS resonator.
Figure 2:
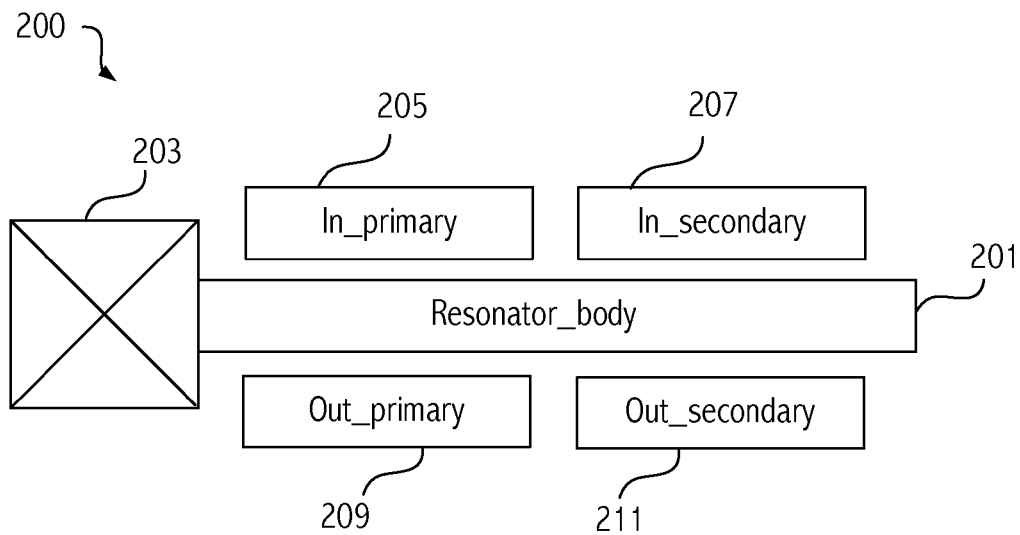
FIG. 2 illustrates a top view of a MEMS structure according to an embodiment of the invention.

Referring to FIG. 2, illustrated is an exemplary embodiment of the invention. A MEMS structure 200 for an oscillator is formed with a resonator body 201 fixed to an anchor 203. Rather than having a single drive electrode as shown in FIG. 1, the total electrode area for both drive (input) and sense (output) are split into multiple electrodes. In the illustrated embodiment in FIG. 2, the drive electrodes are split into a primary electrode 205 and a secondary electrode 207. During start-up, e.g., as a result of a power-on condition, the set of drive electrodes 205 and 207 are used together to increase transduction and lower motional impedance (Rx). After start-up, the secondary drive electrode can be turned off, which raises motional impedance, but the MEMS structure 200 can sustain oscillation with a higher motional impedance with just the primary electrode. Given a fixed gain in the oscillator, starting up oscillation requires a lower Rx than is required to sustain oscillation after oscillation has started. The linearity is not critical during the startup period.

The sense electrode is also split into primary electrodes 209 and secondary electrodes 211. The primary and secondary sense electrodes are used together during start-up while the secondary electrode may be turned off after start-up, which adds to motional impedance.

Figure 3:
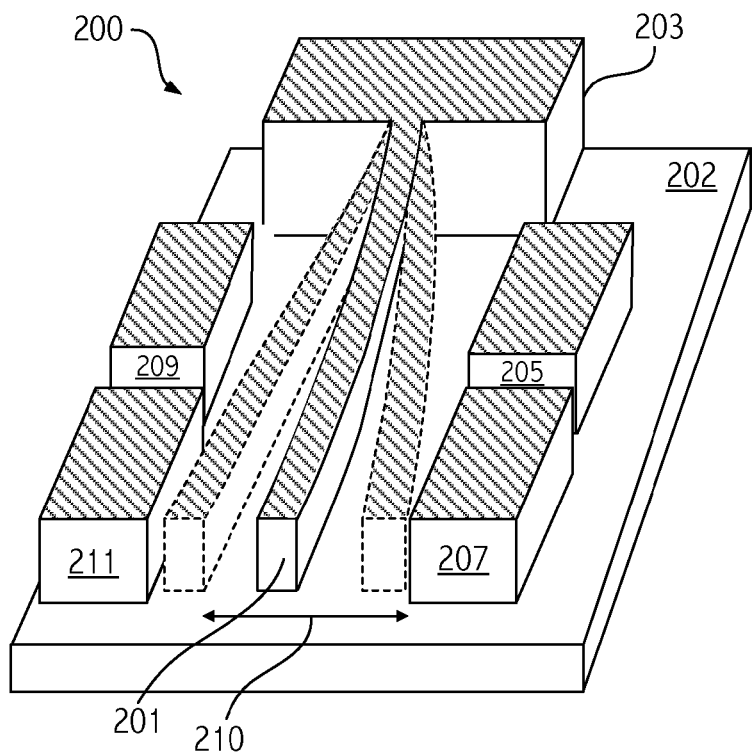
FIG. 3 illustrates another view of the MEMS structure shown in FIG. 2.

FIG. 3 shows another view of the MEMS structure 200. Included in this view is the substrate 202 to which the anchor 203 and electrodes 205-211 are connected.

Figure 4:
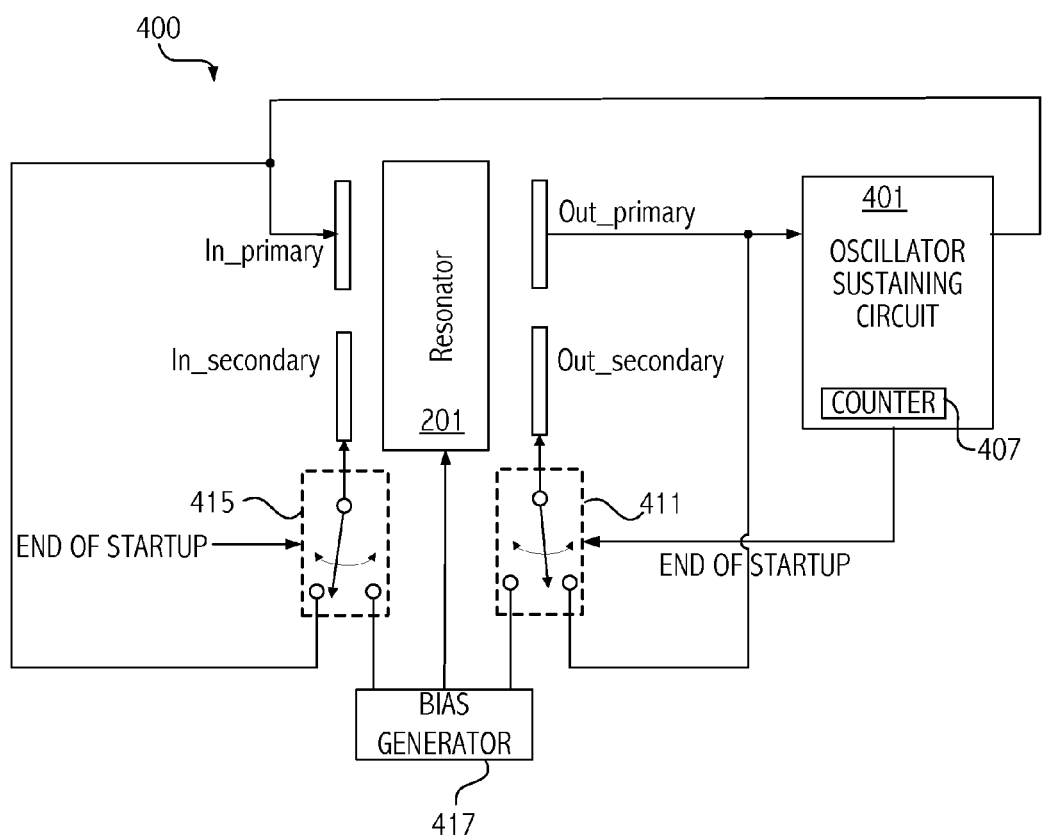
FIG. 4 illustrates a block diagram of an embodiment of the invention including switches to switch secondary electrodes from a primary electrode potential to the resonator potential to disable the secondary electrodes.

FIG. 4 illustrates a high level block diagram of an oscillator 400 incorporating the MEMS structure 200. The oscillator 400 includes the oscillator sustaining circuit 401 that typically utilizes the output of the oscillator sensed by the output electrodes to determine an appropriate voltage to drive the input electrodes to sustain oscillation. The oscillator sustaining circuit can determine when startup has completed based on the sensed output. Startup is considered to be the period during which the amplitude of oscillation is still increasing. Therefore the end of startup can be sensed by determining when an amplitude control loop has stabilized by comparing the amplitude at the drive or sense electrode to a threshold indicative of end of startup, or when a predetermined number of pulses has been counted at the oscillator output in counter 407. Counting pulses could be the least accurate but can be used if the startup time has already been characterized. For example, if the part is known to startup within 0.5 seconds, the counter could count to one second and then indicate end of startup.

FIG. 4 also shows switches 411 and 415 that use the end of startup information from the oscillator sustaining circuit to disable the secondary electrodes by switching their potential to be same potential as the potential of the resonator body. A bias generator 417 supplies the bias voltage for the resonator body 201 and for the secondary electrodes when switched after startup. A separate switch may be provided for each secondary electrode as shown. During startup, the secondary electrode of each set is connected to the same potential as the primary electrode in the set. Note that one set of electrodes is for drive and one set for sense.

Certain parts of the electrodes contribute more to the electrostatic nonlinearity of the resonator. Thus, when the electrodes are split, those parts that contribute more to electrostatic nonlinearity should be the secondary electrodes. For an in-plane resonator as shown in FIGS. 2 and 3 the transduction is proportional to $$\frac{1}{(\text{gap-displacement})^2},$$

where gap is the nominal gap between the electrode and the resonator and displacement relates to the movement of the resonator from its nominal position during oscillation. So the part of the resonator that has the greatest displacement contributes the most to the nonlinearity. Thus, referring to FIG. 2 or 3, the electrodes 207 and 211 are chosen as the secondary electrodes. As seen in FIG. 3, the distance 210 is the maximum distance the resonator 201 is disengaged from the electrode 207 during oscillation. Eliminating the portion of the electrode that contributes more to nonlinearity allows steady state operation in a more linear region and can improve phase noise and frequency stability. In addition, the lower motional impedance at start-up due to the additional resonators can provide faster, more reliable startup of the oscillator. Power handling is the limit of linear operation, beyond which the frequency becomes dependent on amplitude of oscillation. Beyond a certain vibration amplitude, the amplitude-frequency relationship begins to exhibit hysteresis as well. By utilizing switchable electrodes that reduce transduction when switched off, non-linear operation and hysteresis can be more readily avoided.

Figure 5:
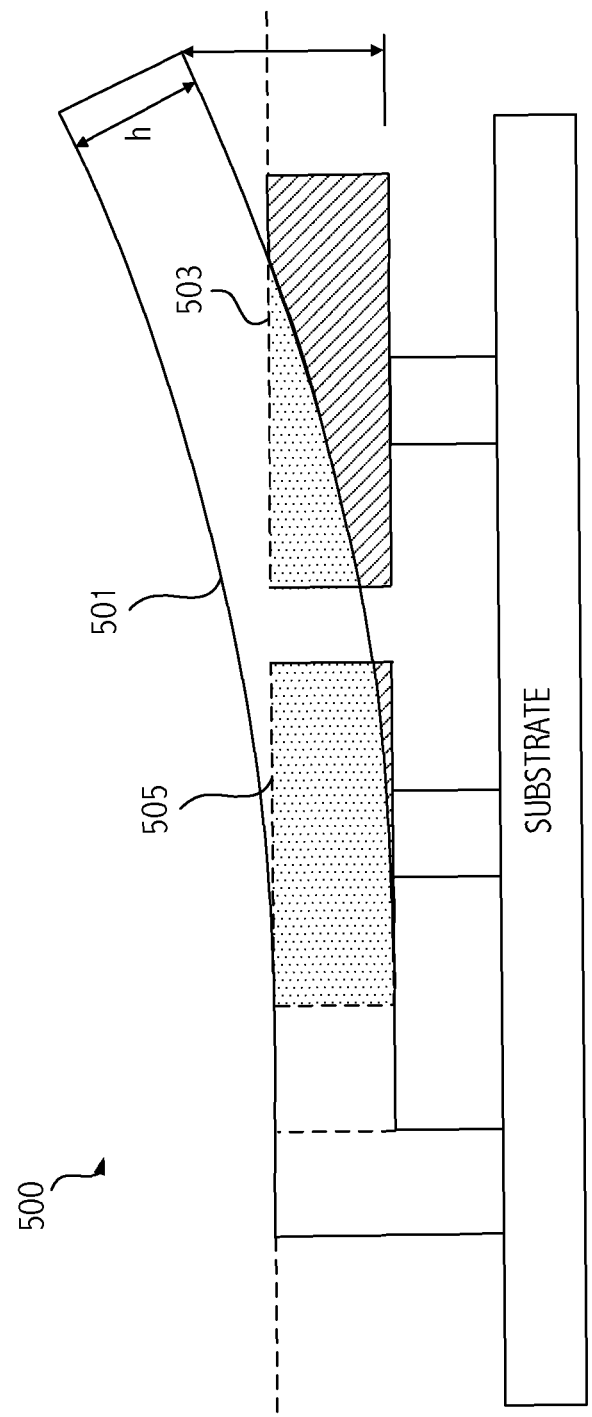
FIG. 5 illustrates a MEMS structure according to another embodiment of the invention.

While the discussion has centered on MEMS oscillators in which the resonator body oscillates in-plane, the approach is equally valid for out-of-plane resonators or torsional mode resonators. FIG. 5 illustrates an out-of-plane resonator MEMS structure 500 in which the resonator body 501 can be seen to move out-of-plane. The MEMS structure 500 has primary and secondary electrodes 503 and 505, respectively. Only one set of electrodes is shown, but the other set of electrodes would be similarly configured. For an out of plane resonator such as shown in FIG. 5, the part of the electrode that is less disengaged from the resonator body during oscillation contributes more to nonlinearity. Thus, electrode 503 that is farthest from the anchor will be chosen as the primary electrode and electrode 505 as the secondary.

Note that while the description above has turned off both drive and sense secondary electrodes, other embodiments may just turn off the drive electrodes after startup. That could reduce the displacement while maintaining the same sense transduction. The overall motional impedance would still increase.

The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. A MEMS oscillator comprising:
    a resonator body;
    a first set of drive electrodes that includes a primary electrode and a secondary electrode, to drive movement of the resonator body;
    a circuit to determine that startup of the MEMS oscillator has completed and provide an indication thereof; and
    wherein the primary and secondary electrodes are configured to be used together during the startup of the MEMS oscillator and the secondary electrode is configured to be disabled responsive to the indication that the startup has completed.

2. The MEMS oscillator as recited in claim 1, further comprising:
    a second set of primary and secondary sense electrodes configured to be used together during the startup of the MEMS oscillator and wherein the secondary electrode of the second set is disabled responsive to the indication that the startup has completed.

3. The MEMS oscillator as recited in claim 1, wherein the primary and secondary electrodes are configured to be operable together during the startup of the MEMS oscillator by connecting the primary and secondary electrodes to a same potential during the start-up.

4. The MEMS oscillator as recited in claim 1, wherein the secondary electrode is coupled to a potential of the resonator body to disable the secondary electrode.

5. The MEMS oscillator as recited in claim 1, wherein the primary and secondary electrodes are electrically isolated from one another.

6. The MEMS oscillator as recited in claim 1, wherein the secondary electrode contributes more to electrostatic non-linearities than the primary electrode.

7. The MEMS oscillator as recited in claim 1, wherein the secondary electrode is less disengaged from the resonator body during oscillation than the primary electrode.

8. The MEMS oscillator as recited in claim 1, wherein the resonator body resonates in one of an in-plane mode and an out-of-plane mode.

9. The MEMS oscillator as recited in claim 1 further comprising:
a counter to count a predetermined number of pulses of an output of the MEMS oscillator output to determine that startup has completed.

10. A method of operating a MEMS oscillator comprising:
during startup of the MEMS oscillator, using a first set of electrodes together to drive movement of a resonator body, the first set including a primary and secondary electrode;
determining an end of the startup of the MEMS oscillator and providing an indication thereof; and
responsive to the indication of the end of startup of the MEMS oscillator, disabling the secondary electrode and using the primary electrode to sustain oscillation of the MEMS oscillator.

11. The method as recited in claim 10 further comprising:
using a primary and secondary electrode of a second set of electrodes together to sense movement of the resonator body during the startup of the MEMS oscillator; and
responsive to the indication of the end of startup disabling the secondary electrode of the second set and using the primary electrode of the second set to sense movement of the resonator body.

12. The method as recited in claim 10 wherein the using together comprises coupling the primary and secondary electrodes of the first set to a same potential during the startup.

13. The method as recited in claim 12 further comprising connecting the secondary electrode to a potential of the resonator body to disable the secondary electrode.

14. The method as recited in claim 10, wherein the primary and secondary electrodes are electrically isolated from one another.

15. The method as recited in claim 10, wherein the secondary electrode is less disengaged from the resonator body during oscillation than the primary electrode.

16. The method as recited in claim 10 further comprising determining the end of startup by comparing an amplitude of a signal at one of the first set of electrodes or at a sense electrode to a threshold indicative of the end of startup.

17. A MEMS oscillator comprising:
a resonator body;
a first set of drive electrodes having primary and secondary electrodes to electrostatically drive the resonator body;
a second set of sense electrodes having primary and secondary electrodes to sense motion of the resonator body;
wherein the primary and secondary electrodes of each set are configured to be used together during start-up of the MEMS oscillator and the secondary electrode of each set is configured to be disabled after start-up while the primary electrode of each set remains enabled.

18. The MEMS oscillator as recited in claim 17, further comprising a switch to connect the secondary electrode of the first set to a potential of the primary electrode of the first set during startup and to a potential of the resonator body after start-up.

19. The MEMS oscillator as recited in claim 17, wherein the secondary electrode of each set is less disengaged from the resonator body during oscillation than the primary electrode.

* * * * *